US006952079B2

United States Patent
Shiang et al.

(10) Patent No.: US 6,952,079 B2
(45) Date of Patent: Oct. 4, 2005

(54) LUMINAIRE FOR LIGHT EXTRACTION FROM A FLAT LIGHT SOURCE

(75) Inventors: Joseph John Shiang, Niskayuna, NY (US); Marc Schaepkens, Ballston Lake, NY (US); Larry Gene Turner, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 52 days.

(21) Appl. No.: 10/323,448

(22) Filed: Dec. 18, 2002

(65) Prior Publication Data

US 2004/0119402 A1 Jun. 24, 2004

(51) Int. Cl.[7] .................................................. H01J 1/62
(52) U.S. Cl. ...................... 313/506; 313/512; 313/504; 362/84; 362/364
(58) Field of Search ................................. 313/504, 506, 313/512, 500, 501, 110–114; 362/555, 84, 364, 366, 800, 322; 385/129–130

(56) References Cited

U.S. PATENT DOCUMENTS

| 4,751,615 | A | 6/1988 | Abrams ........................ 362/31 |
| 4,767,172 | A | 8/1988 | Nichols et al. .............. 385/146 |
| 5,892,621 | A | 4/1999 | McGregor et al. ........... 359/599 |
| 6,091,195 | A | 7/2000 | Forrest et al. ............... 313/504 |
| 6,347,874 | B1 | 2/2002 | Boyd et al. .................... 362/31 |
| 6,527,411 | B1 | 3/2003 | Sayers ......................... 362/245 |
| 6,547,423 | B2 | 4/2003 | Marshall et al. ............. 362/333 |
| 6,561,690 | B2 | 5/2003 | Balestriero et al. .......... 362/555 |

FOREIGN PATENT DOCUMENTS

| WO | WO 98/17083 | 4/1998 |
| WO | WO 00/57239 | 9/2000 |

*Primary Examiner*—Nimeshkumar D. Patel
*Assistant Examiner*—German Colón
(74) *Attorney, Agent, or Firm*—Fletcher Yoder

(57) ABSTRACT

A shaped light extraction luminaire to gather light from an organic light emitting diode (OLED). Specifically, an inverted and truncated pyramid structure having a recessed area configured to receive an OLED is provided. The luminaire is structured to increase the light emission of the OLED by capturing light emissions that would typically be lost by absorption within the OLED. The luminaire includes angled sides having a reflective material disposed thereon. The luminaire increases the light output of the OLED such that it may be implemented in area lighting applications. Further, an array comprising a plurality of recessed areas and a plurality of angled sides for each of the recessed areas may be implemented.

54 Claims, 3 Drawing Sheets

LUMINAIRE FOR LIGHT EXTRACTION FROM A FLAT LIGHT SOURCE

STATEMENT REGARDING FEDERALLY SPONSORED RESEARCH & DEVELOPMENT

This invention was made with Government support under Contract Number DE-FC26-00NT40989. The Government has certain rights in the invention.

BACKGROUND OF THE INVENTION

High efficiency lighting sources are continually being developed to compete with traditional area lighting sources, such as fluorescent lighting. For example, while light emitting diodes have traditionally been implemented as indicator lighting and numerical displays, advances in light emitting diode technology have fueled interest in using such technology in area lighting. Light Emitting Diodes (LEDs) and Organic Light Emitting Diodes (OLEDs) are solid-state semiconductor devices that convert electrical energy into light. While LEDs implement inorganic semiconductor layers to convert electrical energy into light, OLEDs implement organic semiconductor layers to convert electrical energy into light. Generally, OLEDs are fabricated by disposing multiple layers of organic thin films between two conductors or electrodes. When electrical current is applied to the electrodes, light is emitted from the organic layers. Unlike traditional LEDs, OLEDs can be processed using low cost, large area thin film deposition processes. OLED technology lends itself to the creation of ultra-thin lighting displays that can operate at lower voltages than LEDs. Significant developments have been made in providing general area lighting implementing OLEDs.

However, while traditional OLEDs having a relatively low efficacy (e.g. 3–4 lumens per watt) may be able to achieve sufficient brightness for area lighting at low voltages, the operating life of the OLED may be limited due to the heat generated by the high power level and relatively low efficiency of the device. To provide commercially viable light sources implementing OLEDs, the efficacy of the devices may be improved to reduce the heat generation when operating at a brightness sufficient to provide general illumination. Further, to improve the efficiency of the OLED as a general lighting source, light loss mechanisms may be minimized to increase the amount of useful, ambient light that is converted from the electricity.

Conventional OLEDs generally emit approximately 17–33% of the light generated within the organic layers of the OLED. The reduction in light generated within the OLED to the light emitted to the ambient environment is generally caused by loss mechanisms within the OLED. There are a number of light loss mechanisms in OLEDs, as will be discussed further, herein. The production of high efficiency lighting sources for general illumination suggests that light loss mechanisms within the light source be minimized. In flat panel electroluminescent devices (i.e., devices which convert energy into light), light is generated within a dielectric medium. A significant fraction (greater than 40%, for example) of the light that is generated may not be coupled into the ambient, but rather may be lost due to internal reflection. In addition, depending upon the thickness of the substrate on which the organic semiconductor and electrodes are disposed, a significant fraction of the light (greater than 10%, for example) may emerge from the sides of the device, which may be less useful for general illumination purposes. In large volume lighting applications such losses may represent a significant amount of wasted energy consumption.

To reduce the amount of light lost in OLEDs, a number of different techniques have been implemented in conventional OLED devices. For example, scattering particles may be implemented with devices having vertically reflective sides. Further, mirrors angled at 45 degrees may be implemented to capture light emitted from the pixels on the substrate, as can be appreciated by those skilled in the art. Still further, wedged and ridged-wedge light guides may be implemented. In these implementations light may be deliberately injected from one side of the OLED to provide even, uniform illumination. However, these techniques are generally used to provide backlighting for small areas Further, conventional OLED devices which have been implemented for display applications generally address the preservation of the underlying OLED spatial construction. That is to say that a user of an OLED display may typically be interested in not only seeing a "pixel" but also knowing its exact spatial delineation. Conversely, in a lighting applications, diffuse area lighting that preserves little of the spatial information contained in the OLED patterning may not be important, and in some applications a diffuse, structure-less source may be preferred.

BRIEF DESCRIPTION OF THE INVENTION

In accordance with one embodiment of the present techniques, there is provided a luminaire comprising: a front surface; a recessed portion comprising an interface surface having a first width (W1) extending generally in a first plane at a base of the recessed portion, the interface surface being generally parallel with the front surface, wherein the recessed portion is configured to receive an organic light emitting diode (OLED); and a plurality of sides contiguous with one another, at least partially surrounding the recessed portion and extending between the interface surface and the front surface at an acute angle ($\sigma$) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface.

In accordance with another embodiment of the present techniques, there is provided an organic light emitting diode (OLED) comprising: a first electrode; one or more organic layers disposed on the first electrode and configured to emit visible light; a second electrode disposed on the one or more organic layers and having a first width (W1); and a transparent substrate disposed on the second electrode, wherein the substrate comprises: a front surface; an interface surface optically coupled to the second electrode and having a width equal to the first width (W1), wherein the interface surface is generally parallel to the front surface; and a plurality of sides contiguous with one another, at least partially surrounding the interface surface and extending between the interface surface and the front surface at an acute angle ($\sigma$) with respect to the interface surface, each of the sides having a length and wherein a projection of the length of the sides into a plane generally parallel with the interface surface has a second width (W2), and wherein the angled sides are configured to reflect visible light emitted from the one or more organic layers towards the front surface.

In accordance with yet another embodiment of the present techniques, there is provided an array comprising: a front surface; a plurality of recessed portions, each of the plurality of recessed portions comprising an interface surface having a first width (W1) extending generally in a first plane at a base of the recessed portion, the interface surface being generally parallel with the front surface, wherein each of the plurality of recessed portions is configured to receive a respective organic light emitting diode (OLED); and a plurality of sides at least partially surrounding each of the recessed portions and extending between the interface surface and the front surface at an acute angle (σ) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface.

In accordance with a further embodiment of the present techniques, there is provided an area lighting system comprising: a transparent substrate comprising: a front surface; a plurality of recessed portions, each of the plurality of recessed portions comprising an interface surface having a first width (W1) extending generally in a first plane at a base of the recessed portion, the interface surface being generally parallel with the front surface; and a plurality of sides at least partially surrounding each of the recessed portions and extending between the interface surface and the front surface at an acute angle (σ) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface; and a plurality of organic light emitting diodes (OLED), each of the plurality of organic light emitting diodes disposed in a respective one of the plurality of recessed portions and comprising: a first electrode optically coupled to the interface surface; one or more organic layers disposed on the first electrode and configured to emit visible light; and a second electrode disposed on the one or more organic layers.

BRIEF DESCRIPTION OF THE DRAWINGS

Advantages and features of the invention may become apparent upon reading the following detailed description and upon reference to the drawings in which.

DETAILED DESCRIPTION OF SPECIFIC EMBODIMENTS

Figure 1:
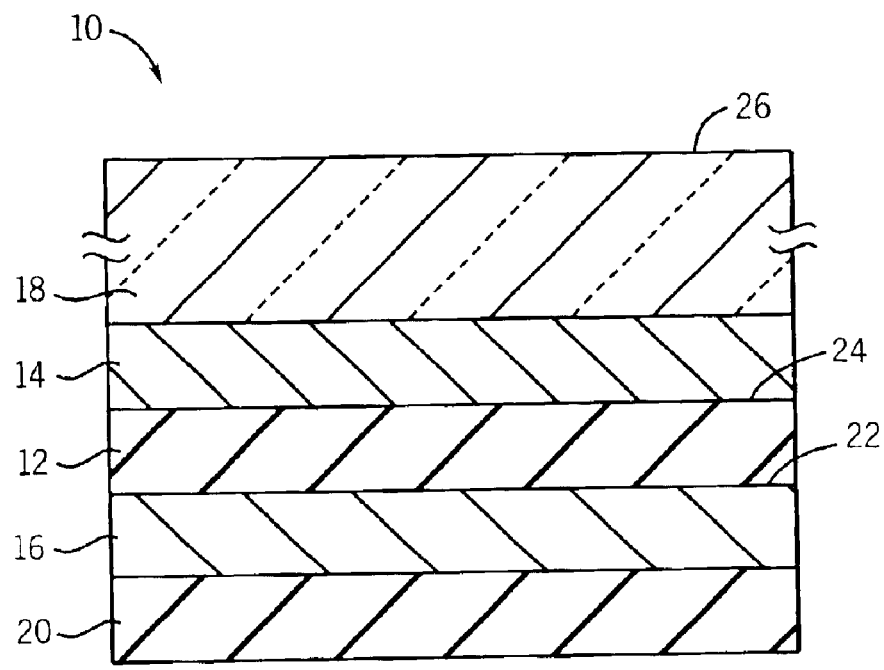
FIG. 1 illustrates a cross-sectional view of an organic light emitting diode (OLED)

FIG. 1 illustrates an exemplary organic light emitting diode (OLED) 10. As can be appreciated, the OLED 10 generally includes an organic layer 12 disposed between a first electrode or anode 14 and a second electrode or cathode 16. The organic layer 12 may comprise a plurality of organic polymer layers, for example. The organic layer 12 may be disposed at a thickness of approximately 100 nm by a spin casting technique, for example. The number, type and thickness of the individual polymer layers that make up the organic layer 12 may vary depending on the application, as can be appreciated by those skilled in the art. For instance, different combinations of organic materials may be implemented to provide different colored light emissions, as can be appreciated by those skilled in the art. The first electrode or anode 14 may include a transparent conductive oxide (TCO) layer, such as indium tin oxide (ITO), for example. The anode 14 may comprise a thickness of approximately 100 nm, for example. The anode 14 may be disposed on a transparent substrate 18. The substrate 18 may comprise polydimethyl silicone (PMDS), polydiphenylsilicone, polycarbonate, poly acrylate and their derivatives, or silicon oxide based glass, for example. In one exemplary embodiment, the substrate 18 may have a thickness of approximately 1 mm. The second electrode or cathode 16 may comprise any suitable metal, such as aluminum or magnesium, as can be appreciated by those skilled in the art. An encapsulation layer 20 may be provided to seal the OLED 10. Further, the OLED 10 may also be encapsulated along the sides of the device (not illustrated). As can be appreciated, when a voltage is applied across the anode 14 and cathode 16, light is emitted from the organic layer 12 and transmitted through the transparent anode 14 and transparent substrate 18 to the ambient environment external to the OLED 10.

As previously described, OLED devices, such as the OLED 10, are generally subject to a number of loss mechanisms that reduce the amount of light produced by the OLED device. For example, once light is produced by the organic layer 12, it is preferably reflected by the metal cathode 16, such that the light can be transmitted through the substrate 18. However, the metal cathode 16 may not provide a perfect reflector, because the dielectric constant of the material is finite. Accordingly, some of the light produced by the organic layer 12 may disadvantageously be absorbed by the second electrode 16 at the interface 22 between the cathode 16 and the organic layer 12. Further, the light emission near the surface of the metal cathode 16 may be dampened due to dipole coupling and QM tunneling.

Further, a significant portion of the light produced by the organic layer 12 is trapped within the organic layer 12, the anode 14 (e.g., ITO), and the substrate 18 of the OLED 10. Light generated within the organic layer 12 may be trapped at the interface 24 between the anode 14 and the organic layer 12 or trapped at the interface 26 between the substrate 18 and the external air. The light may be trapped in the OLED 10 due to the light propagation from a high index medium to a low index medium. As can be appreciated, light that is emitted at angles larger than the critical angle of the interface is completely reflected and thus, will not be emitted from the OLED. Accordingly, only light emitted by the organic layers 12 within a certain range of angles (i.e., less than the critical angle of all interfaces of the layers within the OLED) will be transmitted to the external environment. Also, for area lighting, it may be advantageous for all of the light emitted from the OLED to be transmitted through the top surface (interface 26) of the substrate 18. However, during normal operation of the OLED 10, some of the light may escape through the sides of the substrate 18, which may provide less ambient light overall.

The present techniques provide an efficient means of harvesting the light that is emitted by the OLED 10 at angles that are greater than the critical angle on the top surface (interface 26) of the substrate 18, to increase the light emission of the OLED 10. Further, the present techniques provide a mechanism for collecting the light that is emitted from the sides of the substrate 18 such that it may be redirected through the top surface (interface 26) of the substrate 18 to further increase the light emission of the OLED 10. As can be appreciated, in the absence of absorption losses within the OLED 10 (described above), the application of a light scattering material in optical contact with the OLED 10 would result in the complete out-coupling of generated light (i.e., all of the light that is emitted from the active organic layer 12 into the substrate 18 would be coupled into the ambient environment). However, the reflectivity of the bottom cathode 16 may be constrained by the desirability to also match the work function of the organic materials that make up the organic layer 12 and by the presence of residual absorptions in these materials. Thus, the reflectivity of the cathode 16 may be significantly less than unity and is typically in the range of 60–80% at the emission wavelength. Advantageously, the present techniques direct light away from the low reflectivity areas, such as the cathode 16. The light is directed such that it is directly coupled into the ambient environment or coupled into the anode 14 after one or more bounces off of highly reflective surfaces, as described further below. Accordingly, the total light output of the OLED device is increased relative to conventional OLEDs, such as the OLED 10 illustrated in FIG. 1 and OLEDs coated with a layer of scattering particles.

Figure 2:
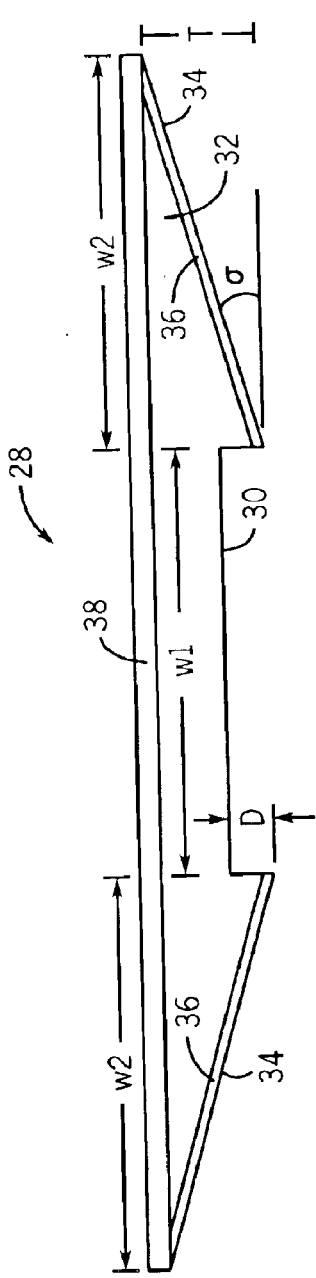
FIG. 2 illustrates a cross-sectional view of a luminaire fabricated in accordance with the present techniques.

FIG. 2 illustrates a cross sectional view of one embodiment of a luminaire 28 in accordance with the present techniques. As used herein, a "luminaire" refers to a device that gathers and directs light such that it can be transmitted in a desired direction. The luminaire 28 includes a nearly flat interface surface 30 that is configured to be optically coupled to the top surface of a substrate of a conventional OLED device, such as the top surface (interface 26) of the substrate 18 of the OLED 10 illustrated in FIG. 1. As used herein, "adapted to," "configured to," and the like refer to elements that are sized, arranged or manufactured to form a specified structure or to achieve a specified result. As illustrated in FIG. 2, the luminaire 28 forms an inverted truncated pyramid structure having a recessed portion configured to receive an OLED device, as further illustrated and described with respect to FIG. 3. In the present exemplary embodiment, the interface surface 30 is generally positioned at the base of the recessed portion. The luminaire 28 is configured to increase the total light output of an OLED device.

The luminaire 28 includes a solid transparent material 32, such as polydimethyl silicone (PDMS) or inorganic glass, for example. The transparent material 32 is chosen to have an optical index of refraction similar to that of the substrate 18. In the present embodiment, the transparent material transmits at least 80% and preferably greater than 90% of visible light. The transparent material 32 of the luminaire 28 may be fabricated by molding, machining or embossing techniques, for example. The luminaire 28 includes angled sides 34 that extend at a relatively shallow acute angle. The angled sides 34 are coated with a highly reflective material 36, such as a highly reflective metal, such as silver, for example. Alternatively, the reflective material 36 may comprise a reflective organic dielectric film (e.g. 3M DFA-42-72 film), an inorganic dielectric film or a thick layer of reflective scattering particles, such as titanium oxide ($TiO_2$), for example. Further, the reflective material 36 may comprise a combination of particles and a reflective metal or film. The reflective material 36 may have a diffuse reflectivity of greater than 95%, for example. The top surface of the luminaire 28 may include a scattering layer 38, such as zirconia ($ZrO_2$), for example, to further increase the light output of the luminaire 28. Further, the scattering layer 38 may comprise small phosphor particles, for example. As can be appreciated, the particles in the scattering layer 38 reflect light generated at angles that are less than the critical angle. For light produced at less than the critical angle, the light is reflected by the scattering layer 38 to the reflective material 36 coating the angled sides 34, where it is redirected through the front of the luminaire 28.

As can be appreciated, the dimensions of the luminaire 28 may vary depending on the available space and the design dimensions of the OLED 10. The luminaire 28 may have a thickness T in the range of approximately 0.5–10.0 mm, for example. The recessed portion of the luminaire 28 has a width W1 in the range of approximately 25–150 mm, for example. The width WI is configured to be equal to the width of the OLED 10, as illustrated further with respect to FIG. 3. Further, the depth D of the recessed region is approximately equal to the thickness of the substrate 18, which may have a thickness in the range of approximately 0.025–5.0 mm, for example. Alternatively, the luminaire 28 may be constructed without a recessed region (i.e. the depth D=0 mm). In accordance with this embodiment, the luminaire 28 comprises an inverted truncated pyramid without a recessed region.

The width W2 on each side of the luminaire 28 may be in the range of approximately 5.0–110.0 mm, for example. The width (W2) may be defined as a projection of the sides 34 into a plane generally parallel to the internal surface 30 and the scattering layer 38, as illustrated in FIG. 2. Finally, the acute angle σ of the sides 34 of the luminaire 28, defined by the arctangent of the total device thickness T of the luminaire 28 divided by the width W2 that the luminaire 28 extends from the substrate 28 (illustrated in FIG. 3), may be in the range of approximately 15°–35°, for example. In other words, σ=arctan(T/W2). The shallow angles of the sides 34 permit increased light collection, as described further below.

Figure 3:
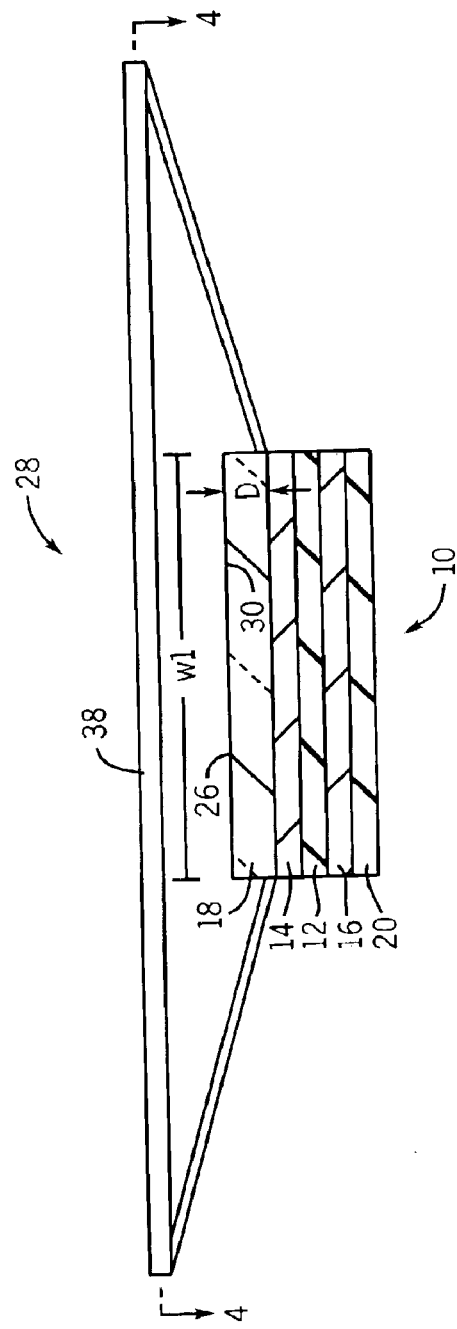
FIG. 3 illustrates a cross-sectional view of an OLED coupled to a luminaire in accordance with the present techniques.

FIG. 3 illustrates a luminaire 28 coupled to an OLED device, such as the OLED 10 of FIG. 1. The luminaire 28 is optically coupled to the substrate 18 using a laminating tape, index matching epoxy or silicone (not illustrated), for example. For instance, in one embodiment, the luminaire 28 is coupled to the substrate using a polydimethyl silicone (PDMS) tape having a thickness of approximately 0.4 mm and having a 0.3% weight of submicron particles. The tape or adhesive may be applied to the flat surface 30 of the luminaire 28 and coupled to the top surface (interface 26) of the substrate 18 by applying mechanical pressure, for example. As can be appreciated, the adhesive may include particles configured to provide color conversion of the light emitted from the OLED 10, as further described below.

As illustrated in FIG. 3, the depth D of the recessed portion of the luminaire 28 is configured to correspond to the thickness of the substrate 18. Further, the width W1 of the recessed portion is configured to correspond to the width of the OLED 10. The luminaire 28 may be fabricated separately from the OLED 10 and optically coupled to the OLED as described above. Alternatively, the OLED 10 may be fabricated directly on the flat interface surface 30 of the luminaire 28. In still another embodiment, the transparent material 32 of the luminaire 28 may form the substrate 18 of the OLED 10. In this embodiment, the anode 14 may be disposed directly on the flat interface surface 30 and the other layers of the OLED 10 may be disposed on the top of the anode 14, as can be appreciated by those skilled in the art.

Figure 4:
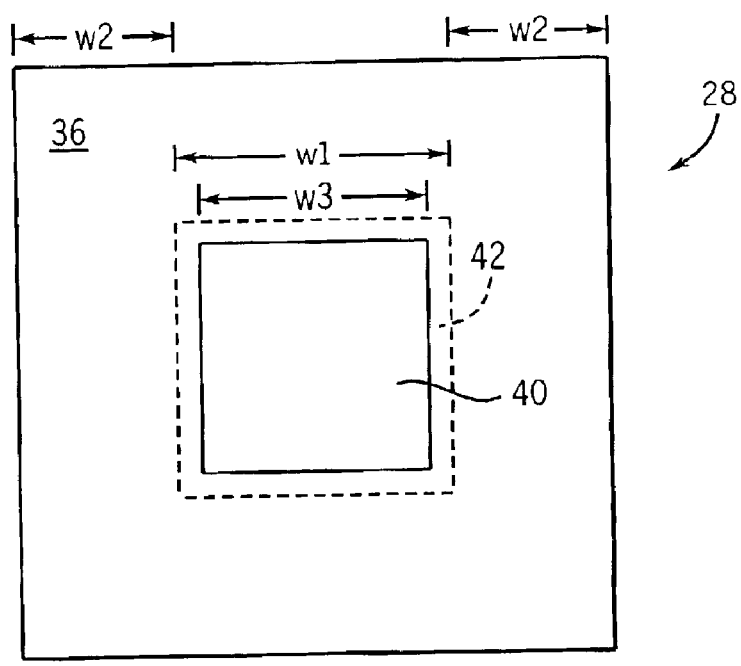
FIG. 4 illustrates a top view of a luminaire coupled to an OLED in accordance with the present techniques.

FIG. 4 illustrates a top view of the luminaire 28 and OLED 10 without the scattering layer 38 and showing certain underlying structures and taken along cut lines 4—4 of FIG. 3. As previously described, the recessed portion of the luminaire 28 has a first width W1 that corresponds to the width of the substrate 18, and a second width W2 that defines the extension width of the sides 34 of the luminaire 28. As can be appreciated, the "active area" 40 of the OLED 10, i.e. the area of the OLED 10 having the organic layer 12, may have a width W3 that is something less than the width W1 of the substrate 18. The remainder of the area defined by the width W1 of the substrate comprises the "inactive area" 42. As previously described, the sides of the luminaire 28 are coated with a highly reflective material 36 that is visible from the top view illustrated in FIG. 4.

By way of example, Table 1 provides simulation results calculated using a commercially available ray-tracing software, such as ASAP, version 7.1, (Breault Research Organization) for example, and corresponding to exemplary embodiments of the luminaire 28 wherein the thickness (T) and the width (W2) have been varied to illustrate the light emission from the luminaire 28. Table 1 can be understood by reference to the following description, as well as the description of FIGS. 1–4. As can be appreciated, Table 1 is provided merely to demonstrate specific simulation results of one embodiment of the present device and is not meant to limit the scope of the invention. For the purpose of Table 1, the substrate 18 comprises glass having an optical index of 1.5. The thickness T of the luminaire 28 was varied between 0.5 mm and 6.5 mm. The width W2 of the luminaire 28 was varied between 0 cm and 50 cm. The amount of light that was emitted was measured and is indicated as a fraction of the amount of light that was emitted from the luminaire 28 as a percentage of the amount of light that was injected into the luminaire 28. In the present exemplary embodiments, a light scattering layer 38 was disposed on top of the luminaire 28. The scattering layer 28 implemented in the present embodiments had a thickness of 0.4 mm. The scattering particle phase function (g) of the scattering layer 28 was assumed to fit the Henyey-Greenstein form, and have a value of g=0.85, a concentration of approximately $1.3 \times 10^{10}$ particles/cc, and a particle radius=0.3 microns. As can be appreciated by those skilled in the art, the selected phase function g is for illustrative purposes only, other alternative combinations of phase functions g and particle loading may also be implemented. The width W1 of the substrate 18 was approximately 15 cm and the width W3 of the active area was approximately 14 cm. The reflectivity of the active area 40 (i.e. the reflectivity of the organic layer 12) was approximately 0.79, which is the experimentally measured value for a blue emitting OLED constructed without the inclusion of phosphor layers, with a cathode 16 comprising a layer of NaF having a thickness of approximately 4 nm and an additional layer of aluminum having a thickness of approximately 200 nm (NaF/Al), as can be appreciated by those skilled in the art. In calculating the emissions, the active area 40 (i.e., the organic layer 12) was assumed to emit light isotropically. As indicated by the results of Table 1 below, as the thickness T1 and the width W2 of the luminaire 28 are increased, the fraction of light emitted from the luminaire 28 increases. Further, the shallower the angle σ of the sides 34 of the luminaire 28, defined by the arctangent of the thickness T of the luminaire 28 and the width W2, the better the light emissions.

TABLE 1

| THICKNESS T (mm) | WIDTH W2 (cm) | MEASURED EMISSION |
|---|---|---|
| 0.5 | 0.00 | 0.454 |
| 0.5 | 1.25 | 0.507 |
| 0.5 | 2.50 | 0.505 |
| 0.5 | 3.75 | 0.515 |
| 0.5 | 5.00 | 0.497 |
| 2.0 | 1.25 | 0.601 |
| 2.0 | 2.50 | 0.621 |
| 2.0 | 3.75 | 0.619 |
| 2.0 | 5.00 | 0.613 |
| 3.5 | 0.00 | 0.466 |
| 3.5 | 1.25 | 0.656 |
| 3.5 | 2.50 | 0.668 |
| 3.5 | 2.50 | 0.684 |
| 3.5 | 2.50 | 0.674 |
| 3.5 | 2.50 | 0.679 |
| 3.5 | 2.50 | 0.677 |
| 3.5 | 3.75 | 0.672 |
| 3.5 | 5.00 | 0.684 |
| 4.0 | 1.25 | 0.664 |
| 4.0 | 2.50 | 0.668 |
| 4.0 | 3.75 | 0.699 |
| 4.0 | 5.00 | 0.697 |
| 6.5 | 0.00 | 0.463 |
| 6.5 | 1.25 | 0.716 |
| 6.5 | 2.50 | 0.734 |
| 6.5 | 3.75 | 0.747 |
| 6.5 | 5.00 | 0.747 |

An additional advantage of the present techniques is that it mitigates the losses caused by the presence of a lossy cathode material 16 (i.e., a cathode 16 having a high absorption ratio). Table 2 illustrates a data comparison between a luminaire 28 having a width W2 equal to 2.0 cm and a luminaire 28 having a width W2 equal to 0.1 cm and an angle σ of less than 45° (e.g., a luminaire 28 having nearly vertical side walls 34). As can be appreciated, Table 2 is provided merely to demonstrate simulation results calculated using commercially available ray-tracing software, such as ASAP, version 7.1, (Breault Research Organization) for example, and is not meant to limit the scope of the invention. The exemplary OLED 10 corresponding to the data of FIG. 2 has a width W1 equal to 7.5 cm and an active area 40 having a width W3 equal to 7.0 cm. Further, for purposes of Table 2, the thickness T of the substrate 18 was assumed to be 6.5 mm, and fabricated from polycarbonate. Further, the present embodiment included a scattering layer having the same parameters as described above with reference to Table 1. In summary, Table 2 demonstrates that the use of reflective vertical walls 34 disadvantageously increases the reflective losses of the cathode 16 when compared to implementing a luminaire 28 having sides 34 configured at a smaller angle σ(e.g. <35°).

TABLE 2

| REFLECTIVITY OF ACTIVE AREA | W1 = 2.0 cm | W1 = 0.1 cm |
|---|---|---|
| 0.99 | 0.918 | 0.799 |
| 0.90 | 0.835 | 0.580 |
| 0.79 | 0.778 | 0.498 |
| 0.69 | 0.750 | 0.458 |

Further, it may be advantageous to implement a substrate 18 and luminaire 28 with a higher optical index of refraction. For example increasing the index of refraction of the substrate/luminaire combination from 1.5 to 1.6 increases the fraction emitted into the ambient environment from 0.75 to 0.78. Optical ray tracing calculations indicate that for the above described device geometries, the presence of a light scattering layer may only change the total light output by a small amount (i.e., <1%). Thus, as can be appreciated by those skilled in the art, the luminaire 28 may be designed to ensure that both color (which is determined in part by the amount of light scattering present in the scattering layer 38) and light output can be separately optimized.

In another exemplary embodiment of the present techniques, a luminaire 28 fabricated from (PDMS) and having an active area width W3 equal to approximately 3.8 cm, a side wall width W2 of 1.2 cm, and a thickness T of approximately 0.6 cm may be implemented. In the present exemplary embodiment, the OLED 10 includes a substrate having a thickness of approximately 1.0 mm. Accordingly, the depth D of the recessed area of the luminaire 28 is also 1.0 mm. The reflectivity of the active area 40 (i.e. the reflectivity of the organic layer 12) was in the range of approximately 0.79–0.81, which is the experimentally measured value for a blue emitting OLED constructed without the inclusion of phosphor layers, with a cathode 16 comprising a layer of NaF having a thickness of approximately 4 nm and an additional layer of aluminum having a thickness of approximately 200 nm (NaF/Al), as can be appreciated by those skilled in the art. The luminaire 28 may be optically coupled to the substrate 18 of the OLED 10 using an optical epoxy, such as Norland 61, for example, as can be appreciated by those skilled in the art. In experiments implementing the present embodiments, the light output of the OLED 10 without the luminaire 28 was measured in the range of approximately 1.32–1.40 lumens. Advantageously, by implementing the presently described embodiment of the luminaire 28, the light output of the OLED 10 coupled to the luminaire 28 was measured in the range of approximately 1.75–1.80 lumens. As can be appreciated, light output may be measured in an integrating sphere, for example. Thus, the luminaire 28 functions to advantageously increase the total light output of the OLED 10 and advantageously reduces the spatial distinction between the light that emerges from the OLED 10.

In addition to the exemplary embodiments described above, additional layers may also be implemented on the luminaire 28. For instance, a color conversion layer may be disposed on the scattering layer 38, to provide white light. As can be appreciated, the organic layer 12 may comprise a number of layers that combine to produce colored light. To provide area lighting, it may be advantageous to provide an additional layer of material on the surface of the luminaire 28 (or at the interface surface 30, as previously described) to convert the colored light to white light. In one exemplary embodiment, the organic layer 12 may comprise a blue-light emitting polymer such as poly (3,4)-ethylendioxythiophene/polystrene sulfonate (PEDOT/PSS). To convert the blue-light to white light for use in area lighting, one or more conversion layers comprising organic molecules such as perylene orange and perylene red and inorganic phosphor particles, such as Cerium doped Yttrium (Gadolinium) Aluminum Garnet [Y(Gd)AG:Ce)], may be disposed on the scattering layer 38. Alternatively, the conversion layer may be disposed directly on the surfaced of the luminaire (i.e., without implementing a scattering layer 38). Still further, the scattering layer 38 may be integrated with the conversion layer, as can be appreciated by those skilled in the art. Alternatively, the color conversion layer may be disposed on the top surface (interface 26) of the substrate 18, such that the luminaire 28 may be disposed on top of the color conversion layer of the substrate 18.

Still further, the upper surface of the luminaire 28 (i.e., the surface opposite the flat interface surface 30 on which the scattering layer 38 is illustrated) may comprise a textured surface to further increase the light output by directing scattered light toward the higher reflective areas of the device (e.g., reflective surfaces 34) and away from the lower reflectivity cathode 16. The ridged surfaces may be fabricated directly opposite to the flat interface surface 30 and/or directly opposite to the angled reflective surfaces 34 to provide directional scattering. The textured surface may be micro-replicated to include a plurality of ridged or jagged features, as can be appreciated by those skilled in the art.

The luminaire 28 may also be hardcoated so as to provide scratch resistance and ultraviolet protection to the upper surface of the luminaire 28. The luminaire 28 may be hard-coated with a silicone hardcoating layer disposed over a primer layer, for example. The silicone hardcoating layer may comprise ultraviolet light absorbers to prevent yellowing of the white light and may be disposed at a thickness of approximately 10 microns, for example. Alternatively, the fabricated transparent material 32 may be dipped into a primer and subsequently dipped into a silicone hardcoating material such that the entire luminaire 28 is hardcoated. The reflective layer 36 may be disposed on the angled surfaces of the sides 34 before or after the hardcoating process, as can be appreciated by those skilled in the art. The hardcoat layer may be modified to impart desirable color conversion or scattering properties, as discussed above and as can be appreciated by those skilled in the art. Additional barrier coatings may also be applied to the luminaire 28 or the luminaire-OLED package (i.e., the luminaire 28 coupled to the OLED 18) to impart water and oxidation resistance.

Further, a highly reflective encapsulant layer may be disposed about the portion of the OLED 10 extending from the luminaire 28. That is to say, the encapsulation layer 20, which may be disposed on the cathode 16 and along the side edges of the OLED 10, as previously discussed, and may comprise a highly reflective material, such as a highly reflective metal, such as silver, for example. Alternatively, the encapsulation layer 20 may comprise a reflective organic dielectric film (e.g. 3M DFA-42–72 film), an inorganic dielectric film or a thick layer of reflective scattering particles, such as titanium oxide ($TiO_2$), for example. Further, the encapsulation layer 20 may comprise a combination of particles and a reflective metal or film having a diffuse reflectivity of greater than 95%, for example. As can be appreciated, the reflective materials may be part of the encapsulation layer 20, or disposed under the encapsulation layer 20.

Figure 5:
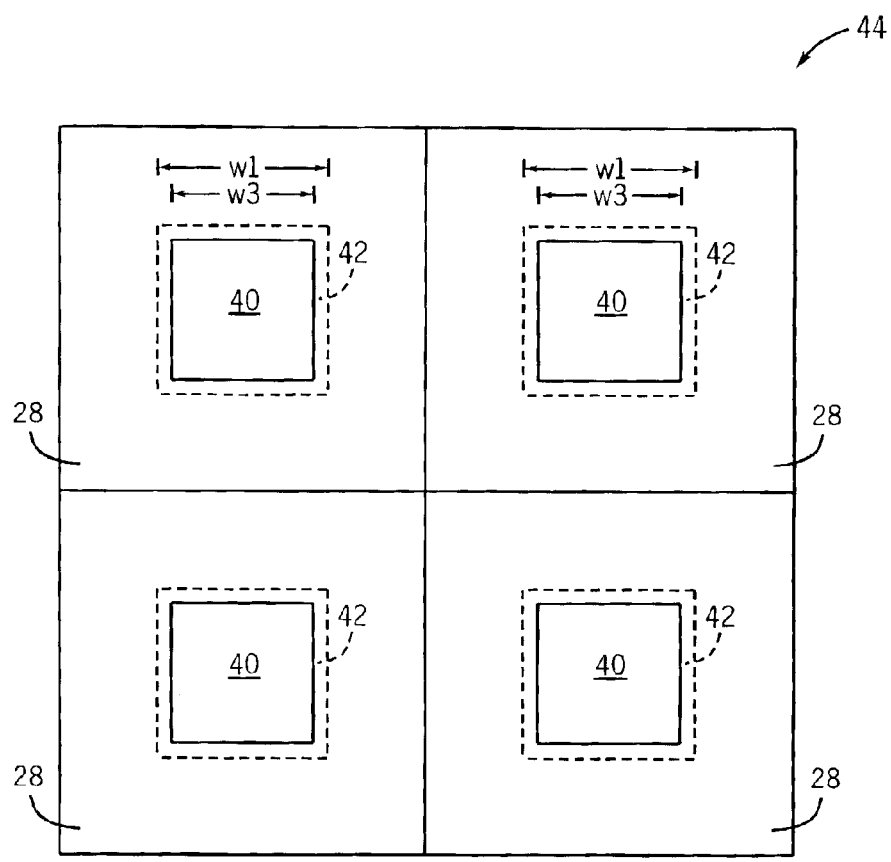
FIG. 5 illustrates a top view of an array of luminaires coupled to a plurality of OLED devices in accordance with the present techniques.
Figure 6:
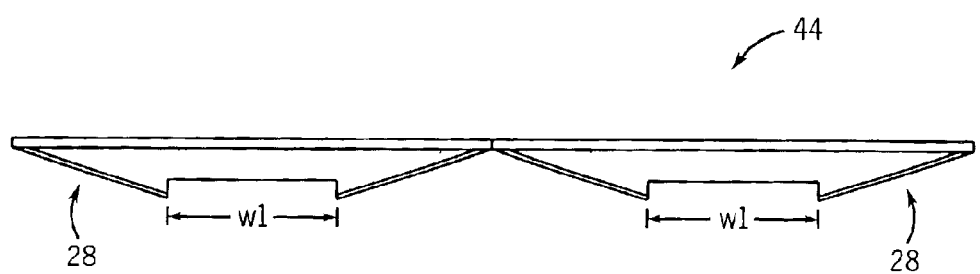
FIG. 6 illustrates a cross-sectional view of an array of luminaires fabricated in accordance with the present techniques.

As can be appreciated, the techniques described above can further be used to fabricate an array of luminaires, as illustrated in FIGS. 5 and 6. FIG. 5 illustrates a top view showing certain underlying structures of a portion of an array 44 comprising four luminaires 28 that may be fabricated in accordance with the techniques described above. As previously discussed, the underlying OLED 10 of each luminaire 28 comprises and active area 40, having a width W3, and a non-active area 42 having a width W1 corresponding to the width of the underlying substrate 18. FIG. 6 illustrates a partial cross-section of the array 44 of luminaires 28. The array includes a plurality of a recessed portions each having a width W1 equal to the width of the substrate 18. The array 44 may be fabricated separately from the OLED 10 and then attached to the OLEDs 10, as previously described. Alternatively, the OLEDs 10 may be fabricated directly in the array 44, such that the substrates 18 of the OLEDs 10 are formed within the recess of each luminaire 28 in the array 44. The array 44 may be formed by injection molding or by filling a mold with a material having an index or near index match to that of the respective substrates 18 of the OLEDs 10 that will be implemented with the array 44. As can be appreciated, the array 44 may include a number of individual luminaires 28 that are coupled to form the array 44, as illustrated in FIGS. 5 and 6. Alternatively, the array 44 may be fabricated from a single piece of material having a plurality of recessed portions and a plurality of angled sides coupled to each of the recessed portions, as can be appreciated by those skilled in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A luminaire comprising:
   a front surface;
   a recessed portion comprising an interface surface having a first width (W1) extending generally in a first plane at a base of the recessed portion, the interface surface being generally parallel with the front surface, wherein the recessed portion is configured to receive an organic light emitting diode (OLED), and wherein the recessed portion comprises a depth (D) that is approximately equal to the thickness of a transparent substrate of the organic light emitting diode that the recessed portion is configured to receive; and
   a plurality of sides contiguous with one another, at least partially surrounding the recessed portion and extending between the interface surface and the front surface at an acute angle (σ) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface.

2. The luminaire, as set forth in claim 1, comprising polydimethyl silicone (PDMS).

3. The luminarie, as set forth in claim 1, wherein the depth (D) is in the range of approximately 0.025–5.0 mm.

4. The luminaire, as set forth in claim 1, wherein each of the plurality of angled sides comprises a metal layer.

5. The luminaire, as set forth in claim 1, wherein each of the plurality of angled sides comprises a mirrored layer.

6. The luminaire, as set forth in claim 1, wherein each of the plurality of angled sides comprises scattering particles.

7. The luminaire, as set forth in claim 1, wherein each of the plurality of angled sides has a diffuse reflectivity of at least 0.95.

8. The luminaire, as set forth in claim 1, wherein the front surface comprises a total width that is equal to the first width (W1) plus two times the second width (W2).

9. The luminaire, as set forth in claim 1, wherein the luminaire comprises a thickness (T) and wherein the angle (σ) is equal to the arctangent of the thickness (T) divided by the second width (W2).

10. The luminaire, as set forth in claim 1, wherein the interface surface comprises a first width (W1) in the range of approximately 25–150 mm.

11. The luminaire, as set forth in claim 1, wherein the angled sides comprise a second width (W2) in the range of approximately 5–110 mm.

12. The luminiare, as set forth in claim 1, wherein the acute angle (σ) is between 15° and 35°.

13. The luminaire, as set forth in claim 1, wherein the plurality of sides comprises four sides forming a generally rectangular outer perimeter of the front surface.

14. The luminaire, as set forth in claim 1, comprising a light scattering layer disposed on the front surface.

15. The luminaire, as set forth in claim 1, comprising a color conversion layer disposed on one of the front surface and the interface surface.

16. The luminaire, as set forth in claim 1, wherein the front surface comprises a textured surface having a plurality of jagged features configured to provide directional scattering of light transmitted from the recessed portion.

17. The luminaire, as set forth in claim 1, comprising a hardcoating layer disposed on the front surface and configured to provide resistance to scratching.

18. The luminaire, as set forth in claim 17, wherein the hardcoating layer comprises light scattering particles.

19. The luminaire, as set forth in claim 1, comprising a hardcoating layer disposed about the entire surface of the luminaire.

20. An organic light emitting diode (OLED) comprising:
    a first electrode;
    one or more organic layers disposed on the first electrode and configured to emit visible light;
    a second electrode disposed on the one or more organic layers and having a first width (W1); and
    a transparent substrate disposed on the second electrode, wherein the substrate comprises:
      a front surface;
      a light scattering layer disposed on the front surface of the substrate;
      an interface surface optically coupled to the second electrode and having a width equal to the first width (W1), wherein the interface surface is generally parallel to the front surface; and
      a plurality of sides contiguous with one another, at least partially surrounding the interface surface and extending between the interface surface and the front surface at an acute angle (σ) with respect to the interface surface, each of the sides having a length and wherein a projection of the length of the sides into a plane generally parallel with the interface surface has a second width (W2), and wherein the angled sides are configured to reflect visible light emitted from the one or more organic layers towards the front surface.

21. The organic light emitting diode (OLED), as set forth in claim 20, wherein the first electrode comprises a metal.

22. The organic light emitting diode (OLED), as set forth in claim 20, wherein the second electrode comprises a transparent conductive oxide (TCO).

23. The organic light emitting diode (OLED), as set forth in claim 20, wherein each of the plurality of angled sides comprises a metal layer.

24. The organic light emitting diode (OLED), as set forth in claim 20, wherein each of the plurality of angled sides comprises a mirrored layer.

25. The organic light emitting diode (OLED), as set forth in claim 20, wherein each of the plurality of angled sides comprises scattering particles.

26. The organic light emitting diode (OLED), as set forth in claim 20, wherein each of the plurality of angled sides has a diffuse reflectivity of at least 0.95.

27. The organic light emitting diode (OLED), as set forth in claim 20, wherein the front surface comprises a total width that is equal to the first width (W1) plus two times the second width (W2).

28. The organic light emitting diode (OLED), as set forth in claim 20, wherein the substrate comprises a thickness (T) and wherein the angle (σ) is equal to the arctangent of the thickness (T) divided by the second width (W2).

29. The organic light emitting diode (OLED), as set forth in claim 20, wherein the interface surface comprises a first width (W1) in the range of approximately 25–150 mm.

30. The organic light emitting diode (OLED), as set forth in claim 20, wherein the angled sides comprise a second width (W2) in the range of approximately 5–110 mm.

31. The organic light emitting diode (OLED), as set forth in claim 20, wherein the acute angle (σ) is between 15° and 35°.

32. The organic light emitting diode (OLED), as set forth in claim 20, wherein the plurality of sides comprises four sides forming a generally rectangular outer perimeter of the front surface.

33. The organic light emitting diode (OLED), as set forth in claim 20, comprising a color conversion layer disposed on one of the front surface and the interface surface.

34. The organic light emitting diode (OLED), as set forth in claim 20, wherein the front surface comprises a textured surface having a plurality of jagged features configured to provide directional scattering of light emitted from the one or more organic layers.

35. The organic light emitting diode (OLED), as set forth in claim 20, comprising a hardcoating layer disposed on the front surface and configured to provide resistance to scratching.

36. The organic light emitting diode (OLED), as set forth in claim 35, wherein the hardcoating layer comprises light scattering particles.

37. An array comprising:
a front surface;
a light scattering layer disposed on the front surface;
a plurality of recessed portions, each of the plurality of recessed portions comprising an interface surface having a first width (W1) extending generally in a first plane at a base of the recessed portion, the interface surface being generally parallel with the front surface, wherein each of the plurality of recessed portions is configured to receive a respective organic light emitting diode (OLED); and
a plurality of sides at least partially surrounding each of the recessed portions and extending between the interface surface and the front surface at an acute angle (σ) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface.

38. The array, as set forth in claim 37, comprising polydimethyl silicone (PDMS).

39. The array, as set forth in claim 37, wherein each recessed portion comprises a depth (D) that is approximately equal to the thickness of a transparent substrate of the respective organic light emitting diode that the recessed portion is configured to receive.

40. The array, as set forth in claim 37, wherein each of the plurality of angled sides has a diffuse reflectivity of at least 0.95.

41. The array, as set forth in claim 37, wherein the array comprises a thickness (T) and wherein the angle (σ) is equal to the arctangent of the thickness (T) divided by the second width (W2).

42. The array, as set forth in claim 37, wherein the acute angle (σ) is between 15° and 35°.

43. The array, as set forth in claim 37, comprising a color conversion layer disposed on one of the front surface and each of the plurality of interface surfaces.

44. The array, as set forth in claim 37, wherein the front surface comprises a textured surface having a plurality of jagged features configured to provide directional scattering of light transmitted from the recessed portion.

45. The array, as set forth in claim 37, comprising a hardcoating layer disposed on the front surface and configured to provide resistance to scratching.

46. An area lighting system comprising:
a transparent substrate comprising:
a front surface;
a light scattering layer disposed on the front surface of the substrate;
a plurality of recessed portions, each of the plurality of recessed portions comprising an interface surface having a first width (W1) extending generally in a first plane at a base of the recessed portion, the interface surface being generally parallel with the front surface; and
a plurality of sides at least partially surrounding each of the recessed portions and extending between the interface surface and the front surface at an acute angle (σ) with respect to the interface surface, each of the sides having a length and wherein a projection of the length of the sides into a second plane generally parallel with the first plane of the interface surface has a second width (W2), and wherein the angled sides are configured to reflect light transmitted from the recessed portion towards the front surface; and
a plurality of organic light emitting diodes (OLED), each of the plurality of organic light emitting diodes disposed in a respective one of the plurality of recessed portions and comprising:
a first electrode optically coupled to the interface surface;
one or more organic layers disposed on the first electrode and configured to emit visible light; and
a second electrode disposed on the one or more organic layers.

47. The area lighting system, as set forth in claim 46, wherein each of the plurality of angled sides has a diffuse reflectivity of at least 0.95.

48. The area lighting system, as set forth in claim 47, wherein the substrate comprises a thickness (T) and wherein the angle (σ) is equal to the arctangent of the thickness (T) divided by the second width (W2).

49. The area lighting system, as set forth in claim 47, comprising a color conversion layer disposed on one of the front surface and the interface surface.

50. The area lighting system, as set forth in claim 47, wherein the front surface comprises a textured surface having a plurality of jagged features configured to provide directional scattering of light emitted from the one or more organic layers.

51. The area lighting system, as set forth in claim 47, comprising a hardcoating layer disposed on the front surface and configured to provide resistance to scratching.

52. The area lighting system, as set forth in claim 51, wherein the hardcoating layer comprises light scattering particles.

53. The area lighting system, as set forth in claim 47, wherein the first electrode comprises a transparent conductive oxide (TCO).

54. The area lighting system, as set forth in claim 47, wherein the second electrode comprises a metal layer.

* * * * *